US010826494B2

(12) United States Patent
Matsumoto

(10) Patent No.: US 10,826,494 B2
(45) Date of Patent: Nov. 3, 2020

(54) HIGH FREQUENCY SWITCH

(71) Applicant: Murata Manufacturing Co., Ltd., Kyoto (JP)

(72) Inventor: Naoya Matsumoto, Kyoto (JP)

(73) Assignee: MURATA MANUFATURING CO., LTD., Kyoto (JP)

( * ) Notice: Subject to any disclaimer, the term of this patent is extended or adjusted under 35 U.S.C. 154(b) by 0 days.

(21) Appl. No.: 16/453,052

(22) Filed: Jun. 26, 2019

(65) Prior Publication Data

US 2019/0319618 A1    Oct. 17, 2019

Related U.S. Application Data

(63) Continuation of application No. PCT/JP2018/001259, filed on Jan. 17, 2018.

(30) Foreign Application Priority Data

Jan. 31, 2017 (JP) .................................. 2017-016201

(51) Int. Cl.
*H03K 17/687* (2006.01)
*H03K 17/693* (2006.01)
(Continued)

(52) U.S. Cl.
CPC ........... *H03K 17/693* (2013.01); *H04B 1/006* (2013.01); *H04B 1/0458* (2013.01)

(58) Field of Classification Search
CPC ............. H03K 17/693; H03K 17/6872; H03K 17/04123; H03K 17/063; H03K 17/0822;
(Continued)

(56) References Cited

U.S. PATENT DOCUMENTS 7,499,678 B2 *   3/2009   Shibagaki .............. H04B 1/006
                                                              333/134
9,634,366 B2 *   4/2017   Murase ................ H04B 1/0057
(Continued)

FOREIGN PATENT DOCUMENTS

| JP | 2005-117467 A | 4/2005 |
|----|---------------|--------|
| JP | 2016-184962 A | 10/2016 |
| JP | 2017-017675 A | 1/2017 |

OTHER PUBLICATIONS

International Search Report for International Application No. PCT/JP2018/001259 dated Feb. 13, 2018.
(Continued)

*Primary Examiner* — Long Nguyen
(74) *Attorney, Agent, or Firm* — Pearne & Gordon LLP

(57) ABSTRACT

A high frequency switch (1) includes a first input/output terminal (30); at least three second input/output terminals (40a to 40e); a first switch (10) including a first common terminal (11) and at least two first selection terminals (12a to 12c) selectively connected to the first common terminal (11); and a second switch (20) including a second common terminal (21) connected to the first selection terminal (12c) with a matching circuit (50) interposed therebetween and at least two second selection terminals (22a to 22c) selectively connected to the second common terminal (21), in which the first common terminal (11) is connected to the first input/output terminal (30), the first selection terminals (12a and 12b) are connected to the second input/output terminals (40a and 40b), and the second selection terminals (22a to 22c) are connected to the second input/output terminals (40c to 40e).

20 Claims, 3 Drawing Sheets

(51) Int. Cl.
*H04B 1/00* (2006.01)
*H04B 1/04* (2006.01)

(58) Field of Classification Search
CPC ......... G05F 3/222; G05F 3/265; H04B 1/006; H04B 1/0458
See application file for complete search history.

(56) References Cited

U.S. PATENT DOCUMENTS

2005/0077978 A1 4/2005 Kizuki et al.
2015/0295595 A1 10/2015 Uejima
2017/0026010 A1 1/2017 Oshita

OTHER PUBLICATIONS

Written Opinion for International Application No. PCT/JP2018/001259 dated Feb. 13, 2018.

* cited by examiner

PRIOR ART

HIGH FREQUENCY SWITCH

This is a continuation of International Application No. PCT/JP2018/001259 filed on Jan. 17, 2018 which claims priority from Japanese Patent Application No. 2017-016201 filed on Jan. 31, 2017. The contents of these applications are incorporated herein by reference in their entireties.

BACKGROUND OF THE DISCLOSURE

Field of the Disclosure

The present disclosure relates to a high frequency switch.

Description of the Related Art

In recent years, there has been a demand for supporting carrier aggregation (CA) in which a plurality of signals having different frequency bands from one another is transmitted and received at the same time. Patent Document 1 discloses a multistage switch structure in which switches are provided in multiple stages. Note that the multistage switch structure is a structure in which switches are connected in multiple stages by connecting one selection terminal of a plurality of selection terminals included in one switch and a common terminal included in another switch to each other. FIG. 4 is a configuration diagram illustrating an example of an existing high frequency switch 100. The high frequency switch 100 has the multistage switch structure in which a first switch 110 and a second switch 120 are provided in multiple stages, and includes a first input/output terminal 130 and second input/output terminals 140a to 140c. For example, in a case where a high frequency switch of SPnT (Single Pole n Throw: n is equal to or more than 3, for example) is configured not by a plurality of switches provided in multiple stages but by one switch, a parasitic capacitance component in the high frequency switch increases, and the parasitic capacitance component causes distortion, whereby the linearity of the input/output terminal of the high frequency switch deteriorates. That is, there is a possibility that the characteristics of the signals in other frequency bands are deteriorated at the time of the CA. In contrast, in the high frequency switch 100, since the parasitic capacitance component in the high frequency switch 100 can be reduced, the input/output terminal of the high frequency switch 100 can be made to have high linearity.

Patent Document 1: Japanese Unexamined Patent Application Publication No. 2005-117467

BRIEF SUMMARY OF THE DISCLOSURE

In the above existing high frequency switch 100, for example, a matching circuit is connected to the first input/output terminal 130, whereby the impedance matching between the high frequency switch 100 and a component (for example, an antenna or the like) connected to the first input/output terminal 130 is performed. However, since a circuit configuration between the second input/output terminals 140a and 140b and the first input/output terminal 130 and a circuit configuration between the second input/output terminal 140c and the first input/output terminal 130 are different from each other, it is difficult for the matching circuit connected to the first input/output terminal 130 to match the respective impedances of the paths from the second input/output terminals 140a to 140c to the first input/output terminal 130.

Accordingly, an object of the present disclosure is to provide a high frequency switch capable of easily matching the respective impedances of a plurality of paths in a multistage switch structure.

In order to accomplish the object described above, a high frequency switch according to an aspect of the present disclosure includes: a first input/output terminal; at least three second input/output terminals; a first switch including a first common terminal connected to the first input/output terminal and at least two first selection terminals selectively connected to the first common terminal; and a second switch including a second common terminal connected to one first selection terminal of the at least two first selection terminals with a matching circuit interposed therebetween and at least two second selection terminals selectively connected to the second common terminal, in which at least another first selection terminal of the at least two first selection terminals is connected to one second input/output terminal among the at least three second input/output terminals, and the at least two second selection terminals are connected to at least two other second input/output terminals among the at least three second input/output terminals.

According to this configuration, since the matching circuit is connected between the first switch and the second switch provided in multiple stages, the respective impedances of the paths from the at least three second input/output terminals to the first input/output terminal can be matched with one another. Specifically, since the matching circuit is provided in the path connecting the at least two other second input/output terminals to which the at least two second selection terminals included in the second switch are connected and the first input/output terminal, by the matching circuit, the impedance of the path from the at least two other second input/output terminals to the first input/output terminal can be matched with the impedance of the path from the at least one second input/output terminal to the first input/output terminal. Accordingly, it is possible to match the respective impedances of the plurality of paths in the multistage switch structure with ease.

Furthermore, to the at least three second input/output terminals, filters each taking a frequency band which is included in a mutually identical frequency band group as a pass band may be connected, respectively.

According to this configuration, since the signals in the frequency bands close to one another are respectively transmitted in the plurality of paths in the high frequency switch, the respective impedances of the plurality of paths in the multistage switch structure can be more easily matched.

Furthermore, the matching circuit may be configured as an inductance element or a capacitance element.

According to this configuration, since the matching circuit is the inductance element or the capacitance element, the matching circuit can be obtained as an element (component), not as wiring or the like.

Furthermore, the high frequency switch may be configured as one semiconductor chip or one package.

According to this configuration, since the first switch and the second switch are integrated as the one semiconductor chip or the one package, the high frequency switch can be miniaturized.

Furthermore, the matching circuit may be provided outside the one semiconductor chip or the one package.

According to this configuration, since the matching circuit is provided outside the one semiconductor chip or the one package, the matching circuit can be retrofitted thereto, and a parameter of the matching circuit can be optimized in accordance with the use environment of the high frequency switch.

Furthermore, the high frequency switch may further include the matching circuit.

According to this configuration, since the matching circuit is provided in the high frequency switch, a high frequency module to which the high frequency switch and the matching circuit are mounted can be miniaturized.

According to a high frequency switch of the present disclosure, it is possible to match the respective impedances of a plurality of paths in a multistage switch structure with ease.

DETAILED DESCRIPTION OF THE DISCLOSURE

Figure 1:
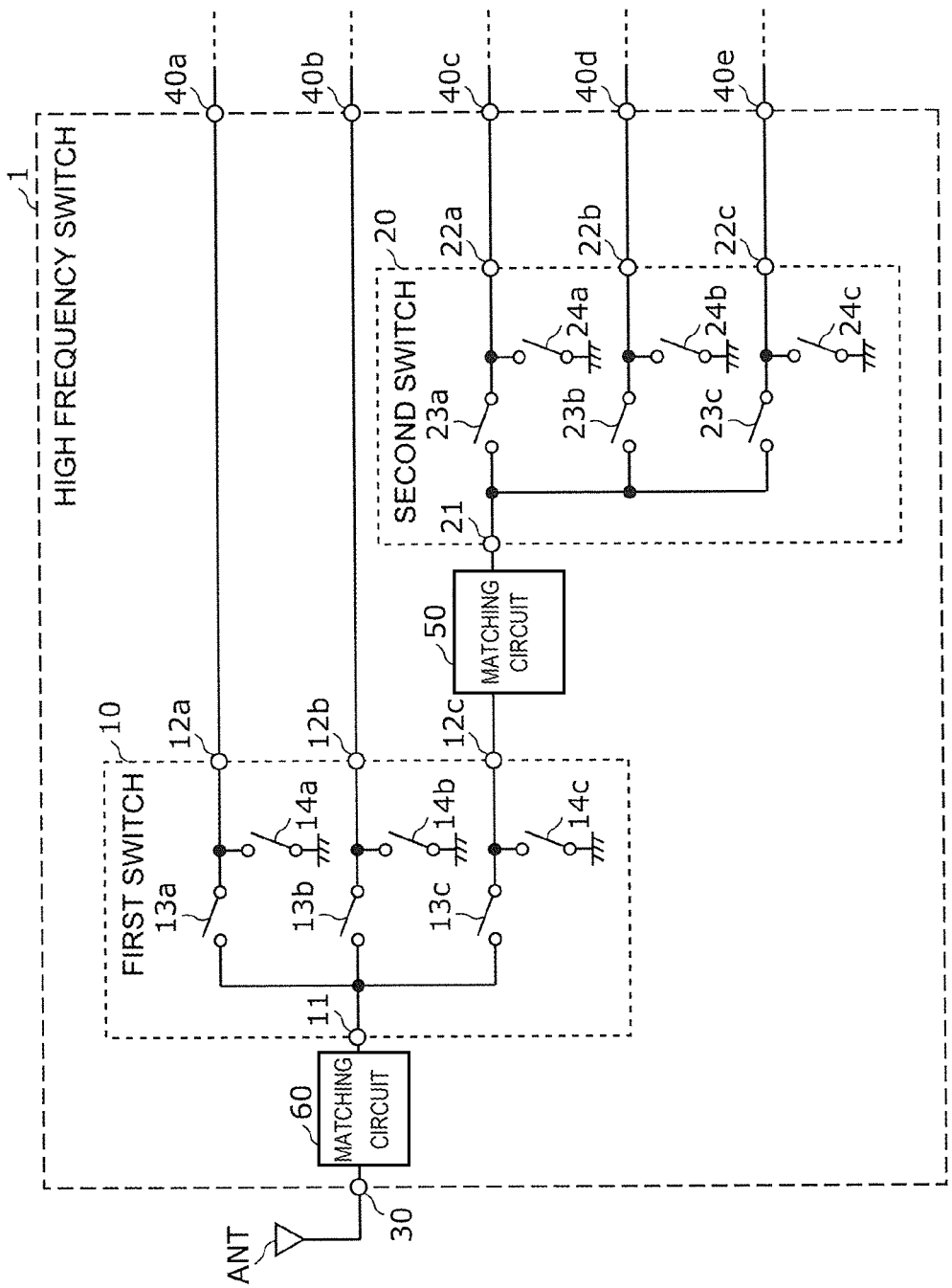
FIG. 1 is a configuration diagram illustrating an example of a high frequency switch and a peripheral circuit thereof according to a first embodiment.

Hereinafter, embodiments of the present disclosure will be described in detail with reference to examples and the drawings. Note that all embodiments described below indicate comprehensive or specific examples. Numerical values, shapes, materials, constituent elements, arrangement and connection forms of the constituent elements, and the like, which will be described in the following embodiments, are examples, and are not intended to limit the present disclosure. Constituent elements which are not described in independent claims among the constituent elements in the following embodiments are described as arbitrary constituent elements. In addition, sizes of the constituent elements illustrated in the drawings are not necessarily strict. In addition, in the drawings, configurations that are substantially identical are given identical reference numerals, redundant descriptions thereof will be omitted or simplified.

First Embodiment

A high frequency switch 1 according to a first embodiment will be described with reference to FIG. 1.

FIG. 1 is a configuration diagram illustrating an example of the high frequency switch 1 and a peripheral circuit thereof according to the first embodiment. In FIG. 1, an antenna ANT is illustrated in addition to the high frequency switch 1.

The antenna ANT is a multi-band capable antenna that is compliant with a communication standard, such as LTE (Long Term Evolution) or the like, for example, which transmits and receives a high frequency signal. The antenna ANT supports the CA, and although not illustrated in FIG. 1, to the antenna ANT, in addition to the high frequency switch 1, another high frequency switch used for communication of a signal in a frequency band included in a frequency band group different from that of the high frequency switch 1 is connected. For example, the high frequency switch 1 is used for communication of a signal of an LB (Low Band), which is a frequency band group including the frequency bands of Bands 8, 12, 13, 26, and the like. Furthermore, for example, the other high frequency switch is used for the communication of a signal in a frequency band used for a GPS (Global Positioning System).

The high frequency switch 1 includes a first switch 10, a second switch 20, and matching circuits 50 and 60. Furthermore, the high frequency switch 1 includes a first input/output terminal 30 and at least three second input/output terminals. In the present embodiment, the high frequency switch 1 includes five second input/output terminals 40a to 40e as the at least three second input/output terminals. Note that the high frequency switch 1 may include three or four, or six or more second input/output terminals.

The first switch 10 includes a first common terminal 11 connected to the first input/output terminal 30 and at least two first selection terminals which are selectively connected to the first common terminal 11. In the present embodiment, the first switch 10 includes three first selection terminals 12a to 12c as the at least two first selection terminals. Note that the first switch 10 may include two, or four or more first selection terminals.

Furthermore, the first switch 10 includes switches 13a to 13c and shunt switches 14a to 14c. By any of the switches 13a to 13c being turned on, the first common terminal 11 and any of the first selection terminals 12a to 12c are selectively connected to each other. Note that two or more switches among the switches 13a to 13c may be simultaneously turned on. Additionally, the shunt switches 14a to 14c are turned on when the switches 13a to 13c connected thereto, respectively, are turned off. Specifically, the shunt switch 14a is turned on when the switch 13a is turned off, the shunt switch 14b is turned on when the switch 13b is turned off, and the shunt switch 14c is turned on when the switch 13c is turned off. With this, since a path which is not used for communication is connected to the ground, isolation among a plurality of paths in the high frequency switch 1 can be enhanced.

The second switch 20 includes a second common terminal 21 and at least two second selection terminals which are selectively connected to the second common terminal 21. In the present embodiment, the second switch 20 includes three second selection terminals 22a to 22c as the at least two second selection terminals. Note that the second switch 20 may include two, or four or more second selection terminals.

Furthermore, the second switch 20 includes switches 23a to 23c and shunt switches 24a to 24c. By any of the switches 23a to 23c being turned on, the second common terminal 21 and any of the second selection terminals 22a to 22c are selectively connected to each other. Note that two or more switches among the switches 23a to 23c may be simultaneously turned on. Additionally, the switches 23a to 23c are turned on when the shunt switches 24a to 24c connected thereto, respectively, are turned off. Specifically, the shunt switch 24a is turned on when the switch 23a is turned off, the shunt switch 24b is turned on when the switch 23b is turned off, and the shunt switch 24c is turned on when the switch 23c is turned off. With this, isolation among a plurality of paths in the high frequency switch 1 can be enhanced.

The switches 13a to 13c, 23a to 23c, and the shunt switches 14a to 14c, 24a to 24c are each, for example, an FET (Field Effect Transistor) switch made of GaAs or CMOS (Complementary Metal Oxide Semiconductor), a diode switch, or the like. Additionally, these switches are switched between an on state and an off state according to a control signal from a control unit (not illustrated) included in the high frequency switch 1 or a high frequency module provided with the high frequency switch 1, an RF signal processing circuit (RFIC: Radio Frequency Integrated Circuit), or the like.

The matching circuits 50 and 60 are each a circuit for impedance matching, and are each configured by, for example, an inductance element or a capacitance element. That is, the matching circuits 50 and 60 are each realized as an element (component) not as wiring or the like. The matching circuits 50 and 60 are each, for example, a series inductor.

Next, a connection form of each terminal in the high frequency switch 1 will be described.

The first common terminal 11 is connected to the first input/output terminal 30. Specifically, the first common terminal 11 is connected to the first input/output terminal 30 with the matching circuit 60 interposed therebetween. The second common terminal 21 is connected to one first selection terminal of the at least two first selection terminals with the matching circuit 50 interposed therebetween. The one first selection terminal of the at least two first selection terminals is the first selection terminal 12*c*. As described above, the high frequency switch 1 has a multistage switch structure in which the first switch 10 and the second switch 20 are provided in multiple stages. With this, since a parasitic capacitance component in the high frequency switch 1 can be reduced, the second input/output terminals 40*a* to 40*e* of the high frequency switch 1 can be made to have high linearity.

At least another first selection terminal of the at least two first selection terminals is connected to at least one second input/output terminal of the at least three second input/output terminals. Note that the at least other first selection terminal of the at least two first selection terminals is the first selection terminals 12*a* and 12*b*, and the at least one second input/output terminal of the at least three second input/output terminals is the second input/output terminals 40*a* and 40*b*. Furthermore, the at least two second selection terminals (second selection terminals 22*a* to 22*c*) are connected to at least two other second input/output terminals of the at least three second input/output terminals. The at least two other second input/output terminals of the at least three second input/output terminals are the second input/output terminals 40*c* to 40*e*.

The first switch 10 is provided between the at least one second input/output terminal (second input/output terminals 40*a* and 40*b*) of the at least three second input/output terminals and the first input/output terminal 30, and the first switch 10 and the second switch 20 are provided between the at least two other second input/output terminals (second input/output terminals 40*c* to 40*e*) of the at least three second input/output terminals and the first input/output terminal 30. That is, a circuit configuration between the second input/output terminals 40*a* and 40*b* and the first input/output terminal 30 and a circuit configuration between the second input/output terminals 40*c* to 40*e* and the first input/output terminal 30 are different from each other. Therefore, for example, in a case where the matching circuit 50 is not provided and the matching circuit 60 is connected to the first common terminal 11, it is difficult to match the respective impedances of the paths from the second input/output terminals 40*a* to 40*e* to the first input/output terminal 30 only with the matching circuit 60. In other words, only with the matching circuit 60, it is difficult to optimize both the impedances of the impedance of the path from the second input/output terminals 40*a* and 40*b* to the first input/output terminal 30 and the impedance of the path from the second input/output terminals 40*c* to 40*e* to the first input/output terminal 30. In contrast, in the present embodiment, since the matching circuit 50 is provided between the first selection terminal 12*c* and the second common terminal 21, by the matching circuit 50, the impedance of the path from the second input/output terminals 40*c* to 40*e* to the first input/output terminal 30 can be matched with the impedance of the path from the second input/output terminals 40*a* and 40*b* to the first input/output terminal 30.

Next, a frequency band of communication in which the high frequency switch 1 is used will be described.

The high frequency switch 1 is used, as described above, for example, for communication of the LB signal. Accordingly, to the second input/output terminals 40*a* to 40*e*, filters each taking a frequency band which is included in a mutually identical frequency band group (LB) as a pass band are connected to each of the second input/output terminals 40*a* to 40*e*, respectively. For example, the second input/output terminals 40*a* and 40*b* correspond to the Bands 12, 13, and the like, and the second input/output terminals 40*c* to 40*e* correspond to the Bands 8, 26, and the like. Specifically, filters taking the Bands 12, 13, and the like as the pass band are connected to the second input/output terminals 40*a* and 40*b*, and filters taking the Bands 8, 26, and the like as the pass band are connected to the second input/output terminals 40*c* to 40*e*. As described above, since signals in frequency bands close to one another are respectively transmitted in the plurality of paths in the high frequency switch 1, the respective impedances of the plurality of paths in the multistage switch structure can be more easily matched.

Also, for example, at the time of the CA, the communication of the LB signal and the communication of the signal of the frequency band used for the GPS in another high frequency switch are simultaneously performed. At this time, the frequency band used for the GPS is the frequency band which is approximately two times the Bands 12, 13, and the like of the LB, and in order not to degrade the characteristics of the signal in the frequency band used for the GPS, it is preferable that the second input/output terminals 40*a* and 40*b* through which the signals of the Bands 12, 13, and the like are inputted/outputted have high linearity. Since the matching circuit 50 is not provided between the second input/output terminals 40*a* and 40*b* and the first input/output terminal 30 and is provided between the second input/output terminals 40*c* to 40*e* and the first input/output terminal 30, the signals inputted/outputted through the second input/output terminals 40*a* and 40*b* are not easily distorted by the matching circuit 50. Therefore, the second input/output terminals 40*a* and 40*b* are terminals which have higher linearity than those of the second input/output terminals 40*c* to 40*e*, and the characteristics of the signals of the frequency band used for the GPS are not easily deteriorated by the signals of the Bands 12, 13, and the like.

Note that the frequency band to which each of the second input/output terminals 40*a* to 40*e* corresponds is not limited to the frequency band included in the LB, but may be a frequency band included in an MB (Middle Band) or a frequency band included in an HB (High Band).

As described above, in the high frequency switch 1, since the matching circuit 50 is connected between the first switch 10 and the second switch 20 provided in multiple stages, the respective impedances of the paths from the at least three second input/output terminals (second input/output terminals 40*a* to 40*e*) to the first input/output terminal 30 can be matched with one another. Specifically, since the matching circuit 50 is provided in the path connecting the at least two other second input/output terminals (second input/output terminals 40c to 40e) to which the at least two second selection terminals (second selection terminals 22a to 22c) included in the second switch 20 are connected and the first input/output terminal 30, by the matching circuit 50, the impedance of the path from the at least two other second input/output terminals (second input/output terminals 40c to 40e) to the first input/output terminal 30 can be matched with the impedance of the path from the at least one second input/output terminal (second input/output terminals 40a and 40b) to the first input/output terminal 30. Accordingly, it is possible to match the respective impedances of the plurality of paths in the multistage switch structure with ease.

Second Embodiment

Next, a high frequency switch 2 according to a second embodiment will be described with reference to FIG. 2.

Figure 2:
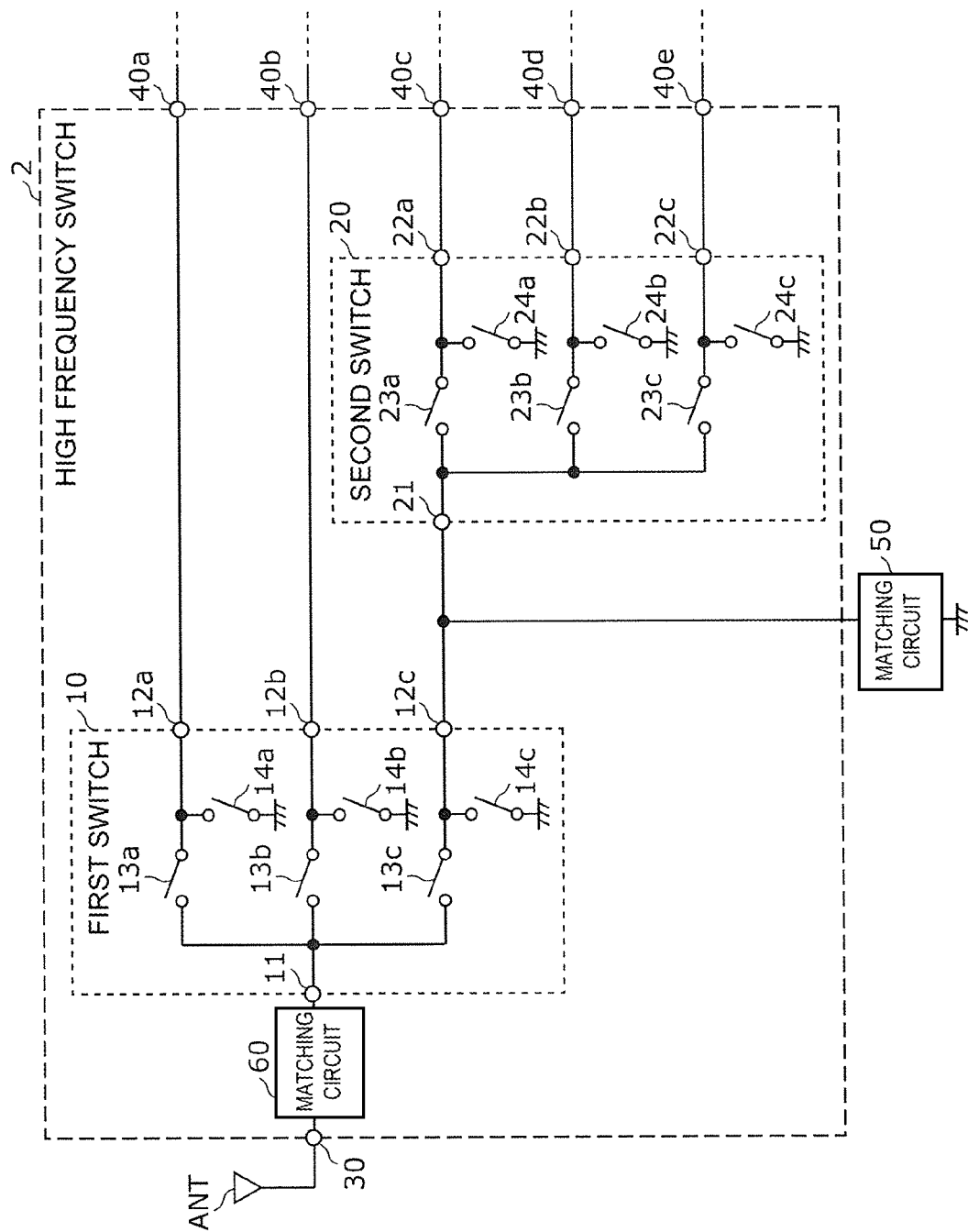
FIG. 2 is a configuration diagram illustrating an example of a high frequency switch and a peripheral circuit thereof according to a second embodiment.

FIG. 2 is a configuration diagram illustrating an example of the high frequency switch 2 and a peripheral circuit thereof according to the second embodiment. In FIG. 2, the antenna ANT and the matching circuit 50 are illustrated in addition to the high frequency switch 2.

A configuration of the high frequency switch 2 according to the present embodiment is different from that of the high frequency switch 1 according to the first embodiment in a point that the matching circuit 50 is not included. Other configurations of the high frequency switch 2 are the same as those of the high frequency switch 1, and thus the description thereof will be omitted.

The high frequency switch 2 is configured as, for example, one semiconductor chip or one package. According to this configuration, since the first switch 10 and the second switch 20 are integrated as the one semiconductor chip or the one package, the high frequency switch 2 can be miniaturized. Note that it is intended that the package is obtained by sealing the first switch 10 and the second switch 20 with resin or fixing them within one housing.

The matching circuit 50 is, for example, a shunt inductor, and is provided outside the high frequency switch 2. Specifically, as illustrated in FIG. 3, the matching circuit 50 is provided outside one semiconductor chip or one package.

Figure 3:
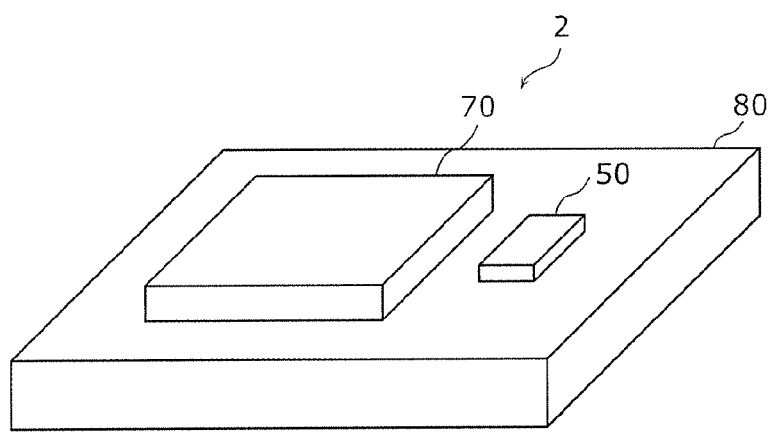
FIG. 3 is an external view of a module to which the high frequency switch and a matching circuit according to the second embodiment are mounted.
Figure 4:
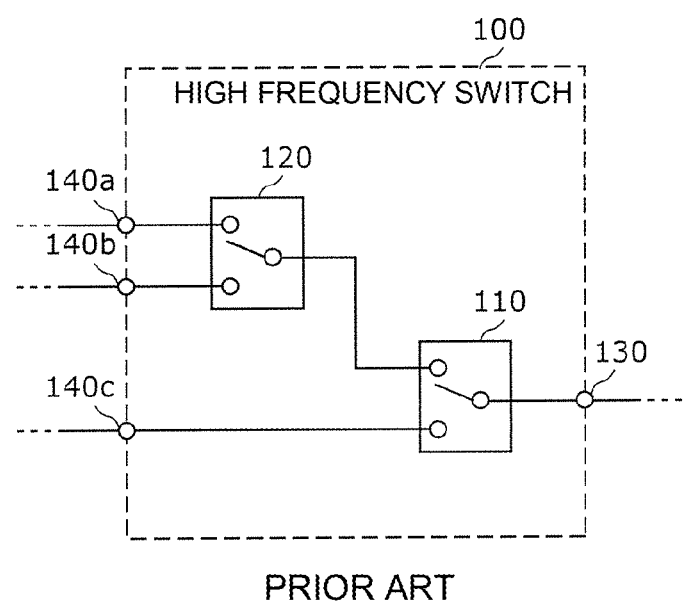
FIG. 4 is a configuration diagram illustrating an example of an existing high frequency switch.

FIG. 3 is an external view of a high frequency module to which the high frequency switch 2 and the matching circuit 50 according to the second embodiment are mounted.

The high frequency switch 2 and the matching circuit 50 are provided as separate bodies, and as illustrated in FIG. 3, the high frequency switch 2 (for example, a semiconductor chip (package) 70) and the matching circuit 50 are mounted on a high frequency module substrate 80. With this configuration, since the matching circuit 50 is provided outside the semiconductor chip (package) 70, the matching circuit 50 can be retrofitted thereto, and a parameter of the matching circuit 50 can be optimized in accordance with the use environment of the high frequency switch 2. Note that the matching circuit 50 may be provided inside the high frequency module substrate 80.

Other Embodiments

Although the high frequency switch according to the embodiments of the present disclosure has been described using the first and second embodiments, the present disclosure is not limited to the embodiments described above. The present disclosure also encompasses other embodiments that are implemented by combining the desired constituent elements in the above-described embodiments, and the modifications obtained by adding various changes to the above-described embodiments, which are conceived by those skilled in the art, without departing from the gist of the present disclosure.

For example, the high frequency switch 1 may also be configured of one semiconductor chip or one package, in the same manner as the high frequency switch 2.

Furthermore, for example, the high frequency switches 1 and 2 each include the matching circuit 60, but may not include it. That is, the matching circuit 60 may be provided as a separate body from the high frequency switches 1 and 2. Furthermore, for example, the high frequency switch 1 includes the matching circuit 50, but may not include it. That is, the matching circuit 50 may be provided as a separate body from the high frequency switch 1.

Furthermore, for example, the first switch 10 may not include the shunt switches 14a to 14c, and the second switch 20 may not include the shunt switches 24a to 24C.

Furthermore, for example, a termination resistor of 50 Ω or the like may be connected between each of the shunt switches 14a to 14c and 24a to 24c and the ground. As a result, it is possible to reduce the change in an amplitude and a phase of a signal caused by signal reflection at the time of a switch changeover.

Furthermore, for example, the high frequency switches 1 and 2 are used for the communication at the time of the CA, but may be used for communication at the time of non-CA.

The present disclosure can be widely used for a communication device such as a mobile phone as a high frequency switch applicable to a multiband system.

1, 2, 100 HIGH FREQUENCY SWITCH
10, 110 FIRST SWITCH
11 FIRST COMMON TERMINAL
12a to 12c FIRST SELECTION TERMINAL
13a to 13c, 23a to 23c SWITCH
14a to 14c, 24a to 24c SHUNT SWITCH
20, 120 SECOND SWITCH
21 SECOND COMMON TERMINAL
22a to 22c SECOND SELECTION TERMINAL
30, 130 FIRST INPUT/OUTPUT TERMINAL
40a to 40e, 140a to 140c SECOND INPUT/OUTPUT TERMINAL
50, 60 MATCHING CIRCUIT
70 SEMICONDUCTOR CHIP (PACKAGE)
80 HIGH FREQUENCY MODULE SUBSTRATE

The invention claimed is:

1. A high frequency switch comprising:
a first input/output terminal;
at least three second input/output terminals;
a first switch including a first common terminal connected to the first input/output terminal and at least two first selection terminals selectively connected to the first common terminal; and
a second switch including a second common terminal connected to one first selection terminal of the at least two first selection terminals with a matching circuit interposed between the second common terminal and the one first selection terminal and at least two second selection terminals selectively connected to the second common terminal,
wherein another first selection terminal of the at least two first selection terminals is connected to one second input/output terminal among the at least three second input/output terminals, and the at least two second selection terminals are connected to at least two other second input/output terminals among the at least three second input/output terminals.

2. The high frequency switch according to claim 1, wherein the matching circuit is shunt-connected to a signal path connecting the one first selection terminal and the second common terminal.

3. The high frequency switch according to claim 1, further comprising filters each taking a frequency band which is included in a mutually identical frequency band group as a pass band, one of said filters being connected to each of the at least three second input/output terminals, respectively.

4. The high frequency switch according to claim 2, further comprising filters each taking a frequency band which is included in a mutually identical frequency band group as a pass band, one of said filters being connected to each of the at least three second input/output terminals, respectively.

5. The high frequency switch according to claim 1, wherein the matching circuit is configured as an inductance element or a capacitance element.

6. The high frequency switch according to claim 2, wherein the matching circuit is configured as an inductance element or a capacitance element.

7. The high frequency switch according to claim 3, wherein the matching circuit is configured as an inductance element or a capacitance element.

8. The high frequency switch according to claim 4, wherein the matching circuit is configured as an inductance element or a capacitance element.

9. The high frequency switch according to claim 1, wherein the high frequency switch is configured as one semiconductor chip or one package.

10. The high frequency switch according to claim 2, wherein the high frequency switch is configured as one semiconductor chip or one package.

11. The high frequency switch according to claim 3, wherein the high frequency switch is configured as one semiconductor chip or one package.

12. The high frequency switch according to claim 4, wherein the high frequency switch is configured as one semiconductor chip or one package.

13. A high frequency module comprising:
the high frequency switch according to claim 1.

14. The high frequency module according to claim 13, wherein the matching circuit is provided outside the high frequency switch.

15. A high frequency module comprising:
the high frequency switch according to claim 2.

16. A high frequency module comprising:
the high frequency switch according to claim 3.

17. A high frequency module comprising:
the high frequency switch according to claim 4.

18. A high frequency module comprising:
the high frequency switch according to claim 5.

19. The high frequency module according to claim 15, wherein the matching circuit is provided outside the high frequency switch.

20. The high frequency module according to claim 16, wherein the matching circuit is provided outside the high frequency switch.

\* \* \* \* \*